United States Patent [19]

Sage

[11] Patent Number: 4,555,770

[45] Date of Patent: Nov. 26, 1985

[54] CHARGE-COUPLED DEVICE GAUSSIAN CONVOLUTION METHOD

[75] Inventor: Jay P. Sage, Newton Centre, Mass.

[73] Assignee: The United States of America as represented by the Secretary of the Air Force, Washington, D.C.

[21] Appl. No.: 541,820

[22] Filed: Oct. 13, 1983

[51] Int. Cl.[4] .......................... G06G 7/12; G06G 7/00; G06G 7/02; H03H 19/00

[52] U.S. Cl. .................................... 364/819; 364/820; 364/826; 364/862; 333/165

[58] Field of Search ............... 364/819, 820, 807, 602, 364/862, 826, 604; 357/24, 31; 377/61, 62; 333/165

[56] References Cited

U.S. PATENT DOCUMENTS

| | | | |
|---|---|---|---|
| 3,801,883 | 4/1974 | Tiemann | 364/604 X |
| 4,016,567 | 4/1977 | Buss | 364/826 X |
| 4,071,906 | 1/1978 | Buss | 333/165 X |
| 4,149,128 | 4/1979 | White | 333/165 X |
| 4,156,923 | 5/1979 | Lampe et al. | 364/819 X |
| 4,161,033 | 7/1979 | Martinson | 364/604 X |
| 4,223,233 | 9/1980 | Cappon et al. | 333/165 X |
| 4,267,580 | 5/1981 | Bond et al. | 364/862 X |
| 4,350,976 | 9/1982 | Benoit-Gonhn et al. | 364/862 X |
| 4,458,324 | 7/1984 | Burke et al. | 364/826 X |
| 4,491,930 | 1/1985 | Hyatt | 364/602 |

*Primary Examiner*—Jerry Smith
*Assistant Examiner*—Charles B. Meyer
*Attorney, Agent, or Firm*—Donald J. Singer; Richard J. Donahue

[57] ABSTRACT

A Gaussian convolution is produced in a CCD imager or shift register by a method involving a special clocking sequence. The principle of operation, analagous to the process of diffusion, involves the deliberate intermixing of adjacent charge packets in a controlled way. Amounts of charge are exchanged between adjacent pixels a number of times, the result approximating the convolution of the image with a Gaussian function whose width is dependent upon the number of mixing cycles.

4 Claims, 3 Drawing Figures

FIG. 1
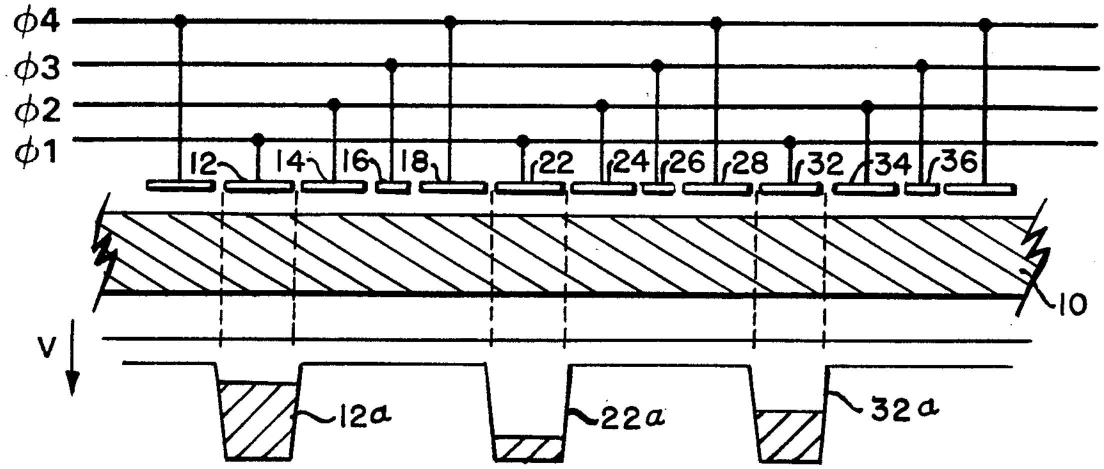
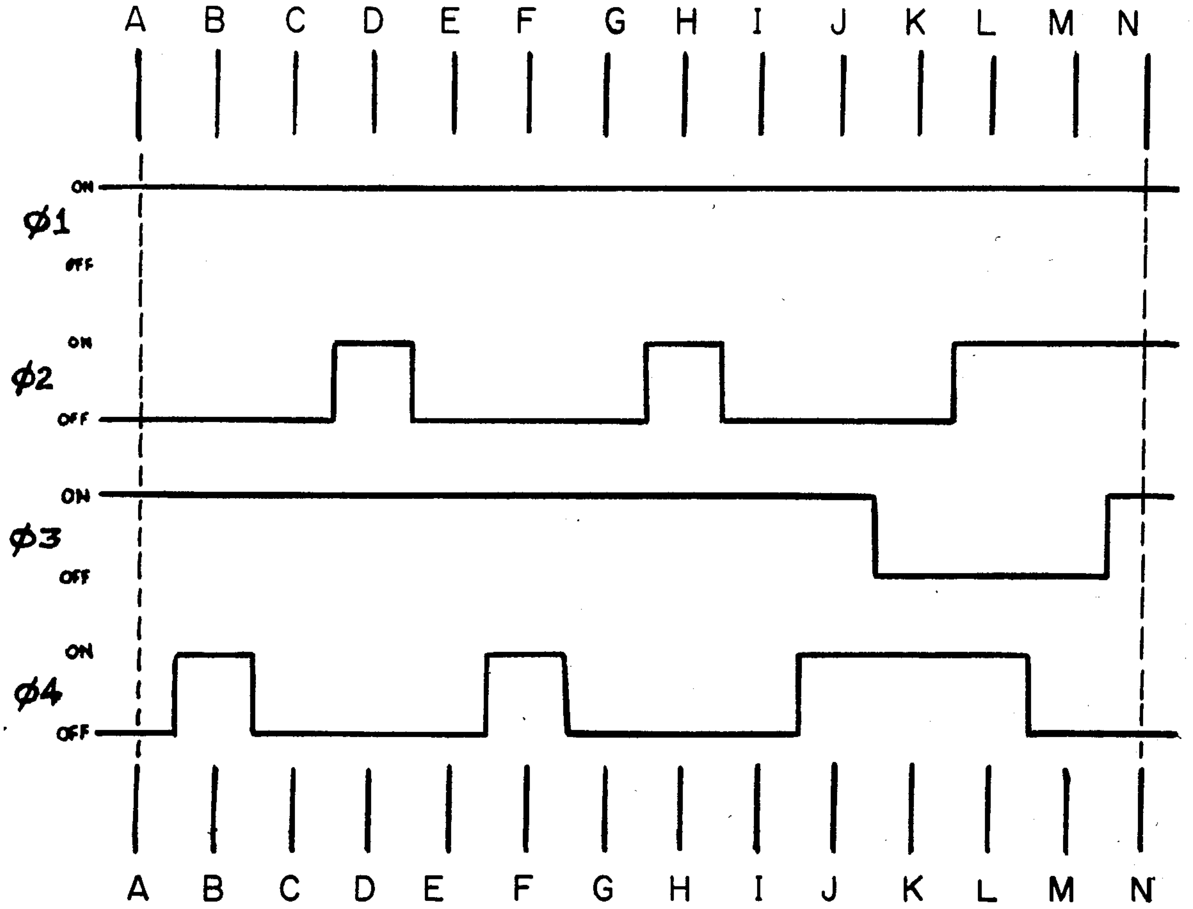
FIG. 3

CHARGE-COUPLED DEVICE GAUSSIAN CONVOLUTION METHOD

STATEMENT OF GOVERNMENT INTEREST

The invention described herein may be manufactured and used by or for the Government for governxental purposes without the payment of any royalty thereon.

BACKGROUND OF THE INVENTION

The present invention concerns a novel method for performing Gaussian convolution in a charge transfer device used as an image sensor or as a shift register array containing any signal there Gaussian convolution is desired.

One of the essential steps required in the processing of optical images which are either forxed or transferred into the wells of a charge transfer device, such as a charge-coupled device (CCD), is the accurate detection of the edges of objects in the image. This has been successfully accomplished at the Artificial Intelligence Laboratory of the Massachusetts Institute of Technology by a technique called the difference-of-Gaussian (DOG) technique. In this technique, the original image is convolved with each of two properly chosen Gaussian functions and the results are subtracted. The edges of objects with a characteristic size or spacing related to the widths of the Gaussian functions appear as zero values. For a detailed discussion of this technique, reference should be made to a paper on this subject entitled "Theory of Edge Detection" by D. Marr and E. Hildreth, Proc. R. Soc. London B207 (1980), pp 187–217. Present implementations of the DOG algorithm are carried out on digital computers and require extensive hardware and substantial computational times.

SUMMARY OF THE INVENTION

It is therefore an objective of the present invention to provide a more efficient method for performing the Gaussian convolution of a sensed image.

This objective is achieved by exploiting the relationship between Gaussian convolution and the physical process of diffusion. Diffusive mixing or spreading, which is described mathematically by Gaussian convolution, is the cumulative result of many small mixings or spreadings. If diffusion can be allowed or caused to occur in a controlled way within an optical signal processing device, then the Gaussian convolution will result naturally, quickly, and for all pixels simultaneously.

One such signal processing device which has found use both as an imager and as a shift register array for solid state optical images is the above-mentioned CCD array. A CCD array consists basically of a semiconductor substrate and a plurality of electrodes insulated from and capacitively coupled to the substrate. Means are provided for introducing electric charge carriers into the semiconductor subsrate which are stored beneath the various electrodes as incremental packets of charge. Transfer of the mobile charge carriers to an adjacent storage well is effected by proper interrelationships between the voltages on adjacent electrodes so that moving potential wells are established which carry the charge packets to a device at which their presence or absence is sensed.

In the present invention, the CCD is operated in a manner contrary to normal practice where great care is taken to assure that the individual charge packets are kept separate and distinct during the transfer process. Instead, in the present invention, gating signals are provided which permit a deliberate mixing of charge packets in a prescribed manner to achieve Gaussian convolution.

A BRIEF DESCRIPTION OF THE DRAWINGS

Additional objectives, features and advantages of the present invention will become apparent from the following description when read in conjunction with the accompanying drawings, wherein:

FIG. 1 is a schematic representation of a section through a four-phase, one-dimensional CCD imager or shift register, and also shows typical channel potential profiles obtained during its operation;

FIG. 3 illustrates the clocking waveforms corresponding to the CCD operation shown in FIG. 2.

DESCRIPTION OF THE PREFERRED EMBODIMENTS

Figure 2:
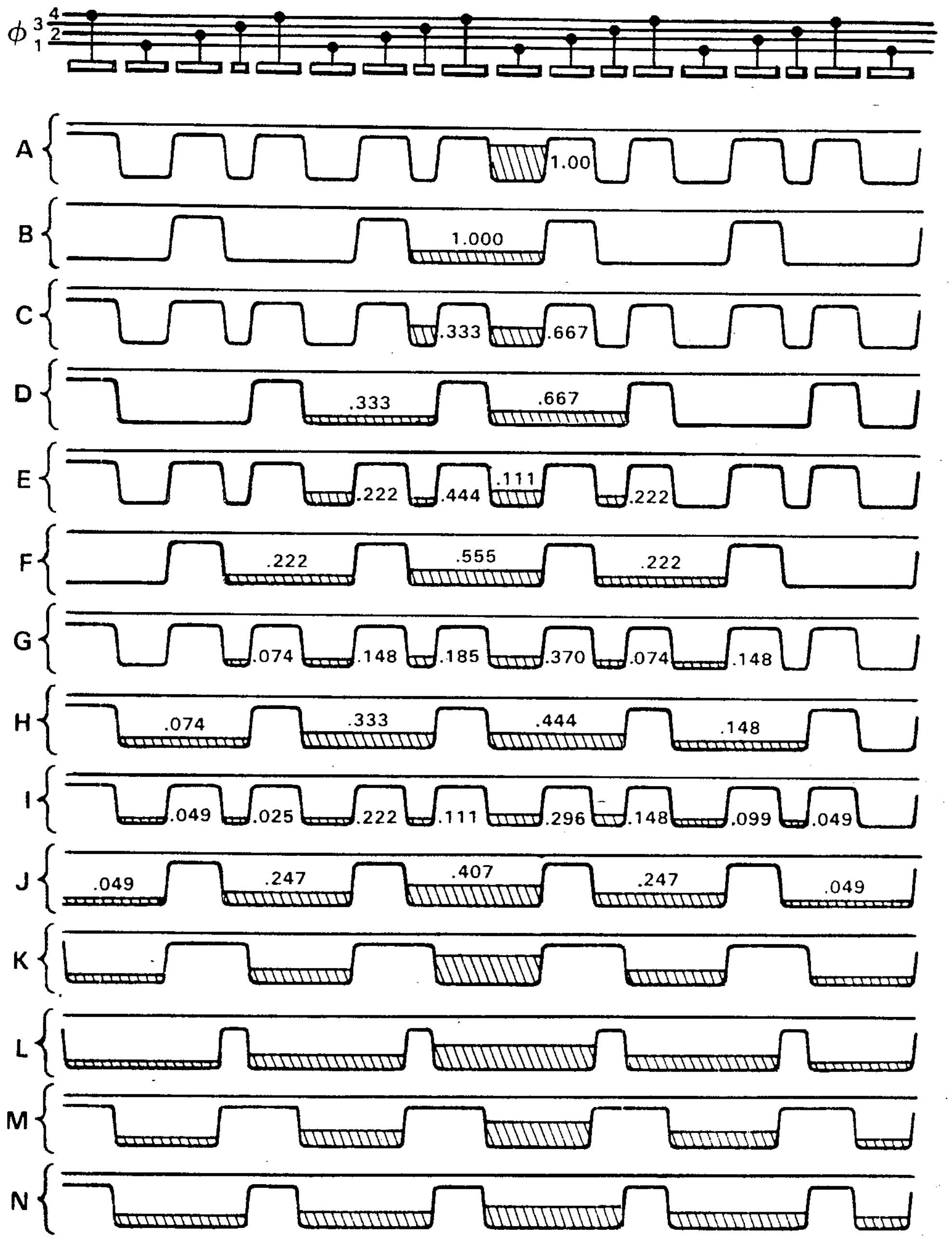
FIG. 2 illustrates an evolution of the Gaussian diffusion of an image charge in the CCD structure during operation of the present invention.

Gaussian convolution is produced in the CCD by using a special clocking sequence. The principle of operation, following the idea of diffusion, is to deliberately intermix adjacent charge packets in a controlled way. If small amounts of charge are exchanged between adjacent pixels (picture elements) many times, the result approaches the convolution of the image with a Gaussian function whose width depends on the number of mixing cycles.

The structure of a section of a one-dimensional CCD shift register or imager used as a Gaussian convolver is shown in FIG. 1 and includes a semiconductor substrate 10 having a plurality of electrodes, such as electrodes 12, 14, 16 etc., arranged above substrate 10 and insulated therefrom to form individual storage wells in the substrate. Between the wells that contain charge packets representing the image intensity of a pixel, such as the wells 12*a*, 22*a* and 32*a* depicted in FIG. 1, there are other charge storage wells (not shown in this figure) that serve as mixing wells. Such mixing wells are formed below the electrodes 16, 26 and 36. For the device in FIG. 1, the electrodes 16, 26 and 36 have areas that are one half of the areas of the pixel electrodes 12, 22 and 32 and thus form mixing wells having one half of the storage capacity of the pixel wells 12*a*, 22*a* and 32*a* respectively. In addition, the device contains transfer electrodes on either side of each mixing well to couple the mixing wells to the pixel wells when mixing is desired. The transfer electrodes 14 and 18, for example, provide means for forming wells for coupling the pixel wells 12 and 22 respectively to mixing well 16.

A mixing cycle consists of connecting a mixing well first to the pixel well on one side and then to the pixel well on the other side thereof. FIG. 2 shows the potential wells and charge packets formed below the electrodes in the CCD device described above as this process proceeds. It illustrates the case of a point image and shows how that point turns into an approximately Gaussian function. Since the device is linear, any other starting charge pattern will be converted to the convolution of that initial pattern with each pattern shown in the figure. The clocking waveforms required to produce the potential wells illustrated in FIG. 2 are shown in FIG. 3.

FIG. 2 shows two mixing cycles, one from line C through line F and one from line G through line J. Line A shows the initial condition, a single filled pixel well and all other wells empty. Line B shows the mixing wells connected to their pixel wells to the right. This is the point from which mixing cycles are carried out. In line C the mixing wells are isolated from the pixel wells; in line D the mixing wells are connected to the pixel wells to the left; in line E the mixing wells are isolated again; and finally in line F the mixing wells are connected to the pixel wells to the right as at the beginning of the cycle. The initial charge packet sequence

. . . (0.000) (0.000) (1.000) (0.000) (0.000) . . .

has turned into

. . . (0.000) (0.222) (0.555) (0.222) (0.000) . . .

After a second mixing cycle, the result is

. . . (0.049) (0.247) (0.407) (0.247) (0.049) . . .

Lines K through N show the beginning of the standard four-phase clocking that is used to clock the signal represented in line J out of the CCD. This normal clocking out can be initiated after any number of mixing cycles to produce Gaussian function of different widths. Table I (below) compares the charge distribution and the ideal Gaussian distribution after zero to four mixing cycles. The approximation to a Gaussian is accurate to about one percent after only three mixing cycles.

TABLE I

Charge distributions after from 0 to 4 charge mixing cycles compared to the results for an ideal Gaussian distribution.

| Pixel Position: | x = 0 | x = 1 | x = 2 | x = 3 | x = 4 | x = 5 |
|---|---|---|---|---|---|---|
| charge distribution (n = 0) | 1.000 | 0.000 | 0.000 | 0.000 | 0.000 | 0.000 |
| ideal Gaussian | 1.000 | 0.000 | 0.000 | 0.000 | 0.000 | 0.000 |
| charge distribution (n = 1) | 0.555 | 0.220 | 0.000 | 0.000 | 0.000 | 0.000 |
| ideal Gaussian | 0.555 | 0.212 | 0.011 | 0.000 | 0.000 | 0.000 |
| charge distribution (n = 2) | 0.407 | 0.247 | 0.049 | 0.000 | 0.000 | 0.000 |
| ideal Gaussian | 0.407 | 0.242 | 0.051 | 0.004 | 0.000 | 0.000 |
| charge distribution (n = 3) | 0.336 | 0.239 | 0.082 | 0.011 | 0.000 | 0.000 |
| ideal Gaussian | 0.336 | 0.236 | 0.081 | 0.014 | 0.001 | 0.000 |
| charge distribution (n = 4) | 0.292 | 0.225 | 0.101 | 0.025 | 0.002 | 0.000 |
| ideal Gaussian | 0.292 | 0.223 | 0.100 | 0.026 | 0.004 | 0.000 |

The CCD depicted in FIGS. 1 and 2 has mixing wells 16, 26 etc. which have half of the pixel well area. However, a standard four-phase CCD, in which the mixing well areas will be equal to the pixel well areas can be used. The relative size of the mixing well compared to that of the pixel well will determine the specific Gaussian functions that can be produced in accordance with the integer number of mixing cycles. An experiment has seen conducted with a standard four-phase CCD device, and the results that were obtained were those expected theoretically, within the measurement accuracy of the experiment. Table II below, lists the experimentally measured charge distribution and those expected theoretically.

TABLE II

Charge packet sizes as measured from experimental photographs compared to the values expected theoretically for a mixing well of area equal to that of the pixel storage wells.

| 1 cycle | | 2 cycles | | 4 cycles | | 32 cycles | | 16 cycles | | 8 cycles | |
|---|---|---|---|---|---|---|---|---|---|---|---|
| measured | calculated | measured | calculated | measured | calculated | measured | calculated | measured | calculated | measured | calculated |
| 0.75 | 0.75 | 0.95 | 0.94 | 0.97 | 0.97 | 0.67 | 0.68 | 0.84 | 0.84 | 0.98 | 0.95 |
| 0.25 | 0.25 | 0.70 | 0.69 | 0.89 | 0.86 | 0.64 | 0.65 | 0.79 | 0.79 | 0.91 | 0.89 |
| | | 0.30 | 0.31 | 0.65 | 0.64 | 0.60 | 0.59 | 0.66 | 0.66 | 0.80 | 0.77 |
| | | 0.08 | 0.06 | 0.35 | 0.36 | 0.53 | 0.52 | 0.56 | 0.57 | 0.61 | 0.60 |
| | | | | 0.18 | 0.15 | 0.40 | 0.43 | 0.40 | 0.43 | 0.39 | 0.40 |
| | | | | 0.03 | 0.04 | 0.37 | 0.35 | 0.30 | 0.30 | 0.12 | 0.11 |
| | | | | | | 0.29 | 0.26 | 0.17 | 0.19 | 0.04 | 0.04 |
| | | | | | | 0.19 | 0.19 | 0.04 | 0.06 | | |

A two-dimensional Gaussian convolution can be performed by carrying out the above procedure in a full two-dimensional CCD constructed so as to have mixing wells and transfer wells in two orthogonal dimensions. Alternatively, the two-dimensional Gaussian convolution can be produced by performing a one-dimensional convolution in one direction followed by a second one-dimensional convolution in the other direction. The latter can be accomplished using the serial-parallel-serial (SPS) CCD organization that is typical of CCD imaging arrays. For an array that is 256 pixels by 256 pixels, the parallel channels will be convolved in parallel with between 0 and perhaps 50 mixing clock cycles. The serial convolutions for the other direction would take place line-by-line and would require between 0 and perhaps 50 mixing clock cycles for each line for a maximum total of about 12,500 cycles. A full two-dimensional convolution using a special CCD structure would only require a maximum of about 100 mixing cycles to produce the same result. However, since the standard SPS imager would require 65,000 clocking cycles to read the image out, the extra 12,500 cycles would constitute an insignificant additional time and the added complexity of a full two-dimensional CCD would rarely be needed.

Although the invention has been described with reference to a particular embodiment, it will be understood to those skilled in the art that the invention is capable of a variety of alternative embodiments within the spirit and scope of the appended claims. For example, the information stored in the CCD need not necessarily represent an optical pattern or image but might represent any other signal or function where Gaussian convolution is desired. Also, in various alternate embodiments of the invention, it might be desirable to have more than one mixing well interposed between pairs of piexl wells.

What is claimed is:

1. A method of operating a charge transfer device for producing the Gaussian convolution of a signal charge pattern stored therein, said charge transfer device having a semiconductor substrate in which pluralities of signal wells, mixing wells and interposed transfer wells are induced in regions situated below electrodes to which multiphase clock pulses are applied for the storage and selective transfer of signal charge packets, comprising the steps of:

(a) intermixing the charge stored in each of said plurality of mixing wells with the charge stored in the signal well disposed on a first side thereof by activating the interposed transfer well;

(b) isolating the charge stored in each of said plurality of mixing wells from the charge stored in the signal well disposed on said first side therecf by deactivating the interposed transfer well, whereby a fraction of said intermixed charge remains stored in each of said mixing wells;

(c) intermixing the charge stored in each of said plurality of mixing wells with the charge stored in the signal well disposed on a second side thereof by activating the interposed transfer well;

(d) isolating the charge stored in each of said plurality of mixing wells from the charge stored in the signal well disposed on a second side thereof by deactivating the interposed transfer well, whereby a fraction of said intermixed charge remains stored in each of said mixing wells; and (e) repeating each of the above steps a sufficient number of times to achieve a Gaussian distribution of a desired width.

2. The method of operating a charge transfer device as defined in claim 1 wherein the fraction of the charge remaining stored in said mixing wells in steps (b) and (d) constitutes less than fifty percent of the intermixed charge.

3. A method of operating a charge transfer device for producing the Gaussian convolution of the charge pattern stored therein, said charge transfer device being of the type having a semiconductor substrate and a plurality of aligned groups of four electrodes insulated from the substrate, said electrodes being connected to different ones of a four-phase energizing source, for providing sequentially in each group a pixel electrode, a first transfer electrode, a mixing electrode and a second transfer electrode, each forming an associated charge storage well therebelow, comprising the steps of:

(a) energizing said second transfer electrodes and said mixing electrodes to intermix the charge stored in each of said pixel wells with the charge in the mixing wells positioned to the left thereof;

(b) deenergizing said second transfer electrodes to isolate said mixing wells from said pixel wells whereby a portion of the intermixed charge remains in said pixel wells;

(c) energizing said first transfer electrodes and said mixing electrodes to intermix the charge remaining in each of said pixel wells with the charge in the mixing well positioned to the right thereof;

(d) deenergizing said first transfer electrodes to isolate said mixing wells from said pixel wells whereby a portion of the intermixed charge remains in said pixel wells;

(e) energizing said second transfer electrodes and said mixing electrodes to intermix the charge now stored in each of said pixel wells with the charge in the mixing well positioned to the left thereof; and (f) repeating steps (b) through (e) a sufficient number of times to achieve a Gaussian distribution of a desired width.

4. The method of operating a charge transfer device as defined in claim 3 wherein the portion of the charge remaining in each of said pixel wells in steps (b) and (d) constitutes more than fifty percent of the intermixed charge.

* * * * *

UNITED STATES PATENT AND TRADEMARK OFFICE

CERTIFICATE OF CORRECTION

PATENT NO. : 4,555,770

DATED : 26 November 1985

INVENTOR(S) : Jay P. Sage

It is certified that error appears in the above-identified patent and that said Letters Patent are hereby corrected as shown below:

In column 1, at line 14, delete the word "there" and substitute therefor --where--.

In column 1, at line 17, delete the word "forxed" and substitute therefor --formed--.

In column 4, at line 2, delete the word "seen" and substitute therefor --been--.

In column 4, at line 61, delete the word "piexl" and substitute therefor --pixel--.

Signed and Sealed this

*Eighteenth* Day of *February 1986*

[SEAL]

*Attest:*

DONALD J. QUIGG

*Attesting Officer* *Commissioner of Patents and Trademarks*